(12) United States Patent
Ando et al.

(10) Patent No.: US 10,024,908 B2
(45) Date of Patent: Jul. 17, 2018

(54) PROBE AND CONTACT INSPECTION DEVICE

(71) Applicant: Kabushiki Kaisha Nihon Micronics, Tokyo (JP)

(72) Inventors: Hiroyasu Ando, Musashino (JP); Mika Nasu, Musashino (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 14/945,655

(22) Filed: Nov. 19, 2015

(65) Prior Publication Data

US 2016/0146885 A1 May 26, 2016

(30) Foreign Application Priority Data

Nov. 26, 2014 (JP) .................................. 2014-238713
Jul. 28, 2015 (JP) .................................. 2015-148607

(51) Int. Cl.
*H01K 3/10* (2006.01)
*G01R 31/28* (2006.01)
(Continued)

(52) U.S. Cl.
CPC ......... *G01R 31/2891* (2013.01); *G01R 1/067* (2013.01); *G01R 1/07314* (2013.01)

(58) Field of Classification Search
CPC ....... H01L 2924/00014; H01L 2224/92; H01L 2224/05644; H01L 2924/00;
(Continued)

(56) References Cited

U.S. PATENT DOCUMENTS 5,521,519 A * 5/1996 Faure ................. G01R 1/06711
324/72.5
2002/0155735 A1* 10/2002 Zhou ................. G01R 1/06711
439/66

(Continued)

FOREIGN PATENT DOCUMENTS

JP 2010-281583 A 12/2010
JP 2010281583 A * 12/2010 ............. G01R 1/067
(Continued)

OTHER PUBLICATIONS

Extended European Search Report dated May 6, 2016 for the corresponding European Patent Application No. 15195356.9.
(Continued)

*Primary Examiner* — Patrick Assouad
*Assistant Examiner* — Taqi Nasir
(74) *Attorney, Agent, or Firm* — Leason Ellis LLP

(57) ABSTRACT

A probe comprises a first end that contacts and separates from a test object and a second end that contacts a circuit board to perform inspection of the test object. The second end is provided with a rotation restricted portion that restricts rotation of the probe about the axial direction thereof. An extendable portion, which is freely extendable and contractible in the axial direction of the probe and has at least one spiral slit, is provided between the first end and the second end. The second end is formed by a tubular member. Also, at least two of the extendable portions are provided between the first end and the second end, and an intermediate portion is formed between the extendable portions.

15 Claims, 18 Drawing Sheets

(51) Int. Cl.
*G01R 1/067* (2006.01)
*G01R 1/073* (2006.01)

(58) Field of Classification Search
CPC . H01L 2224/81815; H01L 2224/05155; H01L 2224/11; G01R 31/318566; G01R 31/318572; G01R 31/31905; G01R 31/31917; G01R 31/3624; G01R 31/3662; G01R 35/00; G01R 31/31932; G01R 31/32; G01R 31/31926
USPC ............... 324/754.11, 437, 445–446, 324/754.01–758.01, 690, 696, 715, 724, 324/149, 751, 752, 757, 758, 754; 439/482; 438/14, 17
See application file for complete search history.

(56) References Cited

U.S. PATENT DOCUMENTS

| | | | | |
|---|---|---|---|---|
| 2005/0258844 | A1* | 11/2005 | Kister | G01R 1/07357 324/750.25 |
| 2011/0291684 | A1* | 12/2011 | Hasegawa | G01R 1/06722 324/755.01 |
| 2012/0042509 | A1 | 2/2012 | Takeya | |
| 2012/0042516 | A1* | 2/2012 | Takeya | G01R 1/07357 29/852 |
| 2013/0033278 | A1* | 2/2013 | Ohta | G01R 1/06722 324/750.25 |
| 2013/0257467 | A1 | 10/2013 | Tomioka | |

FOREIGN PATENT DOCUMENTS

| | | | | |
|---|---|---|---|---|
| JP | 2014-001997 A | | 1/2014 | |
| JP | 2014001997 A | * | 1/2014 | ............. G01R 1/073 |

OTHER PUBLICATIONS

Office Action dated Mar. 2, 2017 for the corresponding Korean Patent Application No. 10-2015-0166364.

* cited by examiner

PROBE AND CONTACT INSPECTION DEVICE

This application claims the benefit of Japanese Patent Applications No. 2014-238713 filed Nov. 26, 2014 and No. 2015-148607 filed Jul. 28, 2015, all of which are incorporated by reference in their entirety herein.

TECHNICAL FIELD OF THE INVENTION

The present invention relates to a probe and a contact inspection device provided with such a probe, for use in an energization test of semiconductor integrated circuits, and so on.

BACKGROUND OF THE INVENTION

An energization test is conventionally performed on test objects, such as semiconductor integrated circuits, to determine whether the test objects are produced in accordance with exact specifications. Such an energization test is performed using a contact inspection device, such as a probe card, probe unit, and probe block, having plural probes as contacts which are individually pressed against a part to be inspected of a test object. A contact inspection device of this type is used to perform inspection by electrically connecting the parts to be inspected of a test object with a tester.

A contact inspection device of this type establishes electrical connection by applying pressure to the parts to be inspected of a test object with plural probes being in contact thereto. However, as the semiconductor integrated circuits become smaller and more complex, the size of a probe for inspecting the parts to be inspected of a test object has become so small, accordingly. As a result, the probe may buckle if the pressing force that acts on the probe during inspection of a test object is large, or the neighboring probes may contact each other and cause a short-circuit, all leading to a problem that the inspection of the test object may not be able to be performed properly.

Under such circumstances, there is proposed a contact inspection device in which each probe is provided with an extendable portion. The extendable portions expand and contract to absorb a part of the pressing force that acts on the probe during inspection of a test object. Accordingly, buckling of the probe and short-circuit caused by neighboring probes can be controlled (refer to JP 2010-281583 A).

Problem to be Solved by the Invention

This contact inspection device includes: a probe made of a cylindrical member that contacts the parts to be inspected of a test object; a head portion that guides a tip portion of the probe to a predetermined position; a retaining portion that holds an intermediate portion of the probe a base portion that guides a rear end portion of the probe; and an electrode portion that electrically connects to the rear end portion of the probe guided by the base portion.

In this probe, extendable portions having spiral slits are provided between the tip portion and the intermediate portion of the probe as well as between the intermediate portion and the rear end portion of the probe. Accordingly, when the probe is pressed against the parts to be inspected of a test object, the extendable portion bends in the axial direction of the probe and absorbs a part of the pressing force such that the pressing force acting between the probe and the parts to be inspected can be of an appropriate strength.

By the way this probe absorbs a part of the pressing force by the extendable portion bending in the axial direction of the probe. At that time, a part of the pressing force acts on the spiral-shaped extendable portion in the direction of the spiral, and gives the probe a rotating force about the axial direction of the probe. This may cause the probe to rotate about the axial direction. If the probe rotates about the axial direction, the rear end of the probe that is in contact with the electrode portion also rotates about the axial direction. As a result, wear and damage are generated at the electrode portion which is in contact with the rear end portion of the probe. Accordingly, the contact between the rear end portion of the probe and the electrode portion becomes unstable, possibly leading to a contact failure. Consequently the electrical connection between the probe and the electrode portion may become unstable such that the reliability of the contact inspection device is deteriorated.

The present invention has been made in view of the above-mentioned drawbacks, and thus, the purpose of the present invention is to provide a probe that can stabilize electrical connection between the probe and a circuit board as well as a contact inspection device provided with such probe.

SUMMARY OF THE INVENTION

Means for Solving the Problem

In order to achieve the above-mentioned objective, a probe according to a first aspect of the present invention is a probe having a first end that contacts and separates from a test object and a second end that contacts a circuit board to perform inspection of the test object, wherein the second end is provided with a rotation restricted portion that restricts rotation of the probe about the axial direction thereof.

When the first end of the probe is pressed against, a test object with the second end of the probe being in contact with the circuit board, or when the probe is separated from the test object, a rotating force is sometimes generated about the axial direction of the probe. The second end side of the probe is configured to be in contact with the circuit board (not fixed). Thus, when this rotating force is generated, wear and damage to the contact portion may be caused by the rotation. Furthermore, if the probe repeatedly performs the inspection of a test object, this rotation force is generated. Thus, the rotation of the probe will be generated repeatedly between the probe and the circuit board, possibly leading to a greater wear or damage.

According to this aspect, because the rotation restricted portion restricts the rotation of the probe about the axial direction, wear and damage generated at the contact portion between the second end and the circuit board can be controlled. Consequently, the electrical connection between the probe and the circuit board can be stabilized, and thus the reliability of the contact inspection device can be improved.

The probe according to a second aspect of the present invention is the probe according to the first aspect, wherein an extendable portion, which is freely extendable and contractible in the axial direction of the probe and has at least one spiral slit, is provided between the first end and the second end.

According to this aspect, when a first end of the probe contacts the test object, the extendable portion having the spiral slits provided between the first end and the second end contracts in the axial direction and absorbs a part of the pressing force. Then, a part of the pressing force acts on the probe to cause it to rotate about the axial direction. However, because the rotation restricted portion that restricts the rotation of the probe about the axial direction is provided on the second end, the rotation of the probe at the second end thereof about the axial direction is restricted. As a result, wear and damage generated at the contact portion between the second end and the circuit board can be controlled. Accordingly, the electrical connection between the probe and the circuit board can be stabilized, and thus the reliability of the contact inspection device can be improved.

The probe according to a third aspect of the present invention is the probe according to the second aspect, wherein the second end is formed by a tubular member.

The second end of the probe is constituted by a tubular member. Therefore, when rotation occurs repeatedly between the probe and the circuit board, the contact portion of the circuit board wears out annularly. In other words, wear is concentrated on the same portion. As a result, fluctuation in contact pressure occurs between the probe and the circuit board, and electrical connection between the probe and the circuit board becomes unstable.

However, in this aspect, rotation of the second end is restricted by the rotation restricted portion. Accordingly, the rotation at the second end is restricted even when the second end is formed by a tubular member. Thus, generation of wear and damage between the second end and the circuit board can be controlled even more effectively, and the electrical connection between the probe and the circuit board can be stabilized.

The probe according to a fourth aspect of the present invention is the probe according to the second or the third aspect, wherein at least two of the extendable portions are provided between the first end and the second end, and an intermediate portion is formed between the extendable portions.

The probe according to a fifth aspect of the present invention is the probe according to any one of the first to fourth aspects, wherein the rotation restricted portion is formed as a cutaway portion formed by cutting away a part of the second end.

In the present specification, "a cutaway portion formed by cutting away a part of the second end" includes not only forming a cutaway by cutting away a part of the second end, but also includes forming the cutaway portion on the second end by methods other than cutting, such as by pressing and other forming methods.

According to this aspect, because the rotation restricted portion is formed as a cutaway portion, the rotation restricted portion can be easily formed on the second end.

The probe according to a sixth aspect of the present invention is the probe according to any one of the first to fourth aspects, wherein the rotation restricted portion is formed by forming the second end made of the tubular member into a polygonal shape.

According to this aspect, the rotation restricted portion is formed by forming the second end made of a tubular member into a polygonal shape. By forming the shape of the rotation restricted portion in a polygonal shape, force that acts on the rotation restricted portions to restrict the rotation about the axial direction can be dispersed to each surface of the polygonal shape. Accordingly, less force is required to control the rotation at the second end of the probe.

Further, by forming the second end into a polygonal shape, the contact area between the second end and the circuit board increases, thereby increasing the frictional force between the second end and the circuit board. Thus, the rotation of the probe can be controlled. In addition, due to the increase in the contact area, the contact pressure per unit area between the second end and the circuit board can be reduced. Thus, wear can be reduced and the electrical connection between the probe and the circuit board can be stabilized.

Further, because the rotation restricted portion is formed by press forming the second end made of a tubular member, the rotation restricted portion can be easily formed on the second end. Also, because the tubular member is formed into a polygonal shape, the strength (rigidity) of the tubular member can be improved.

The probe according to a seventh aspect of the present invention is the probe according to any one of the first to fourth aspects, wherein the rotation restricted portion is formed as a protrusion that protrudes from the probe in the radial direction of the probe.

The probe according to an eighth aspect of the present invention is the probe according to the first or the second aspect wherein the probe includes: a first contact portion that constitutes a first end of the probe; and a second contact portion that constitutes a second end of the probe, the second contact portion makes a line contact with the circuit board, and the rotation restricted portion is formed as a protrusion that protrudes from the probe in the radial direction of the probe.

The contact inspection device according to a ninth aspect of the present invention is a contact inspection device that performs contact inspection of a test object, including: the plural probes according to the first through eighth aspects: a circuit board that contacts the second end of the probe; and a probe head through which the plural probes are inserted and which is detachably attached to the circuit board, wherein a rotation restricting portion that engages with the rotation restricted portion of the probe is provided on the probe head on a side opposing the circuit board.

According to this aspect, because the rotation restricting portion that engages with the rotation restricted portion of the probe is provided on the probe head on a side opposing the circuit board, rotation of the second end about the axial direction is surely restricted while permitting rotation about the axial direction with respect to the test object on the first end when the first end of the probe is brought into contact with the test object. Accordingly, the electrical connection between the probe and the circuit board can be stabilized, and thus the reliability of the contact inspection device can be improved.

BRIEF DESCRIPTION OF THE DRAWINGS

These and other features and advantages of the present invention will become more readily appreciated when considered in connection with the following detailed description and appended drawings, wherein like designations denote like elements in the various views, and wherein.

DETAILED DESCRIPTION OF THE INVENTION

Figure 1:
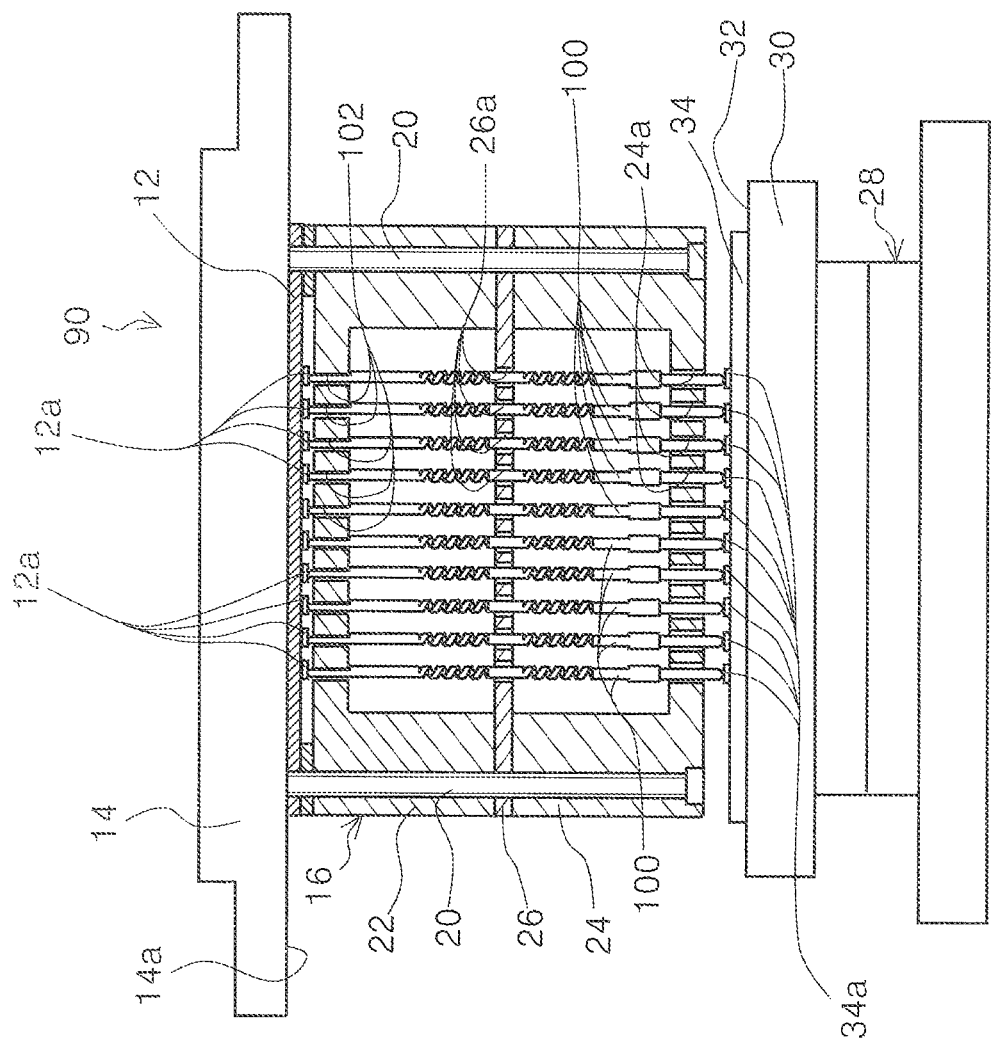
FIG. 1 is a sectional side view of a contact inspection device provided with probes according to a first embodiment of the present invention.

Description is hereinafter made of embodiments of the present invention based on the drawings. The common constituent elements in all the embodiments, which are designated by the same reference numerals, are described only in the first embodiment and their description is omitted in the description of subsequent embodiments.

First Embodiment

<<<Outline of Contact Inspection Device>>>

Figure 2:
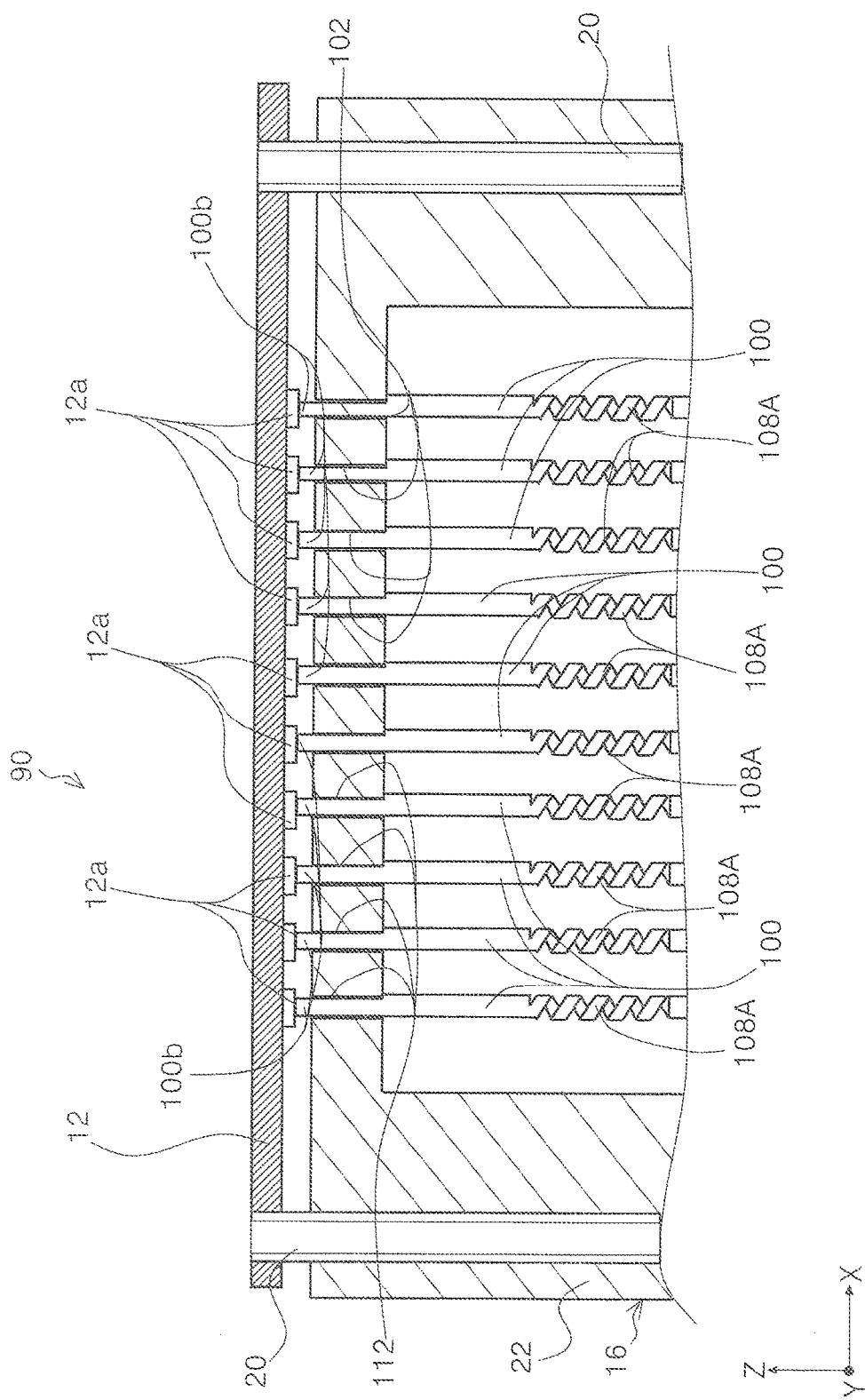
FIG. 2 is an enlarged view of the contact inspection device on a probe substrate side thereof shown in FIG. 1.

FIG. 1 and FIG. 2 illustrate a probe card 90 as one embodiment of a "contact inspection device." The probe card 90 includes a probe substrate 12 as a "circuit board", a reinforcing plate 14, a probe head 16, and plural probes 100. The probe card 90 is electrically connected to a tester (not shown) and is attached to the tester for swingable motion relative to the tester.

In this embodiment, the probe substrate 12 has a disk-like shape, and is constituted as a multi-layer substrate including a ceramic substrate and a wiring substrate although not shown. Plural conductive contact portions 12a are provided on the −Z side surface as viewed in FIG. 1 (which is hereinafter referred to as "lower surface") of the probe substrate 12. In this embodiment, the Z-axis in FIG. 1 indicates the "vertical direction," and the "+Z side" and "−Z side" mean the "upside" and "downside," respectively.

Although not shown, plural wiring paths are provided in the probe substrate 12. Each wiring path is electrically connected at one end to one of the probes 100 via one of the conductive contact portions 12a provided on the lower surface of the probe substrate 12, and it is connected at the other end to one of plural conductive portions (not shown) provided on the +Z side surface (which is hereinafter referred to as "upper surface") of the probe substrate 12. Each conductive portion (not shown) on the upper surface of the probe substrate 12 is connected to a tester (not shown).

The reinforcing plate 14 is attached to the upper surface of the probe substrate 12. The reinforcing plate 14 has a disk-like shape and is formed with a metal member. The −Z side surface of the reinforcing plate 14, in other words, the lower surface of the reinforcing plate 14, which faces the upper surface of the probe substrate 12, is formed as a flat surface 14a. The flat surface 14a of the reinforcing plate 14 (refer to FIG. 1) is formed to have a predetermined flatness (for example, 30 μm) or better. Because the probe substrate 12 attached to the reinforcing plate 14 is forced to have the same flatness as the flat surface 14a, the reinforcing plate 14 defines the flatness of the probe substrate 12.

The probe head 16 is detachably attached to the lower surface of the probe substrate 12 via fastening members 20. The probe head 16 includes an upper probe head 22, a lower probe head 24, and an intermediate retaining member 26. The upper probe head 22 and the lower probe head 24 are spaced apart in the vertical direction. In this embodiment, the upper probe head 22 is placed above and the lower probe head 24 is placed below in the vertical direction. In this embodiment, the upper probe head 22 and the lower probe head 24 are formed of non-conductive material such as ceramic.

The intermediate retaining member 26 is interposed between the upper probe head 22 and the lower probe head 24 in the vertical direction. In this embodiment, the intermediate retaining member 26 is constituted as a film member made of non-conductive resin material.

The upper probe head 22 has plural rotation restricting portions 102 (refer to FIG. 5), while the lower probe head 24 and the intermediate retaining member 26 have plural holes 24a and 26a respectively. The plural rotation restricting portion 102 and the plural holes 24a and 26a extend in the vertical direction, and have common axes extending in the vertical direction. In other words, each rotation restricting portion 102 and the holes 24a and 26a corresponding thereto are arranged coaxially. The rotation restricting portion 102 will be described in detail later.

The plural probes 100 are inserted through the probe head 16. Specifically, each probe 100 is inserted through a set of coaxially-arranged rotation restricting portion 102 and corresponding holes 24a and 26a. In other words, the probes 100 are inserted through the upper probe head 22, the lower probe head 24, and the intermediate retaining member 26. Here, each probe 100 has a first end (lower end) 100a (refer to FIG. 3) and a second end (upper end) 100b (refer to FIG. 3) that individually protrude vertically from the probe head 16.

In the state where the probes 100 are inserted through the rotation restricting portions 102 and the holes 24a and 26a, the intermediate retaining member 26 is forced to move in the direction intersecting the axial direction of the probes 100 (X-axis direction or Y-axis direction in FIG. 1). As a result, an intermediate portion 110 of each probe 100 is pressed by the intermediate retaining member 28 in the direction intersecting the axial direction such that mainly the intermediate portion 110 of the probe 100 bends in the direction intersecting the axial direction. In other words, the probes 100 bend in an arch-shape within the probe head 16, and the probes 100 are retained by the probe head 16.

Further, the plural probes 100 are bent and aligned in the direction intersecting the axial direction, that is, in the same direction, within the probe head 16, by the intermediate retaining member 26. Accordingly, the probe card 90, even when an overdrive acts on each probe 100 during inspection of the test object, is prevented from being short-circuited by the neighboring probes coming into contact each other in the bent state since the bending direction of the probes 100 are regulated in advance by the intermediate retaining member 26.

As shown in FIG. 1, an inspection stage 28 is provided below the probe card 90. The inspection stage 28 is constituted by combining an X-stage, a Y-stage, a Z-stage, and a θ-stage. A chuck top 30 is mounted on top of the inspection stage 28. Thus, the chuck top 30 is positionally adjustable in an X-axis direction, a Y-axis direction orthogonal to the X-axis direction on a horizontal plane, and a vertical direction orthogonal to the horizontal plane (XY plane), i.e., a Z-axis direction. The chuck top 30 is also adjustable in its rotational position (θ-direction) about the Z-axis.

A mounting surface 32, on which a test object 34 is mounted, is provided on top of the chuck top 30. In this embodiment, the test object 34 is a semiconductor wafer into which multiple integrated circuits have been incorporated. Plural electrodes 34a are provided on an upper surface of the test object 34. Because the plural electrodes 34a are brought into contact with the first ends 100a of the probes 100 with the second ends 100b of the probes 100 being in contact with the contact portions 12a of the probe substrate 12, an electrical connection is established between the probe card 90 and the test object 34.

<<<Regarding Configuration of Probe>>>

Figure 3:
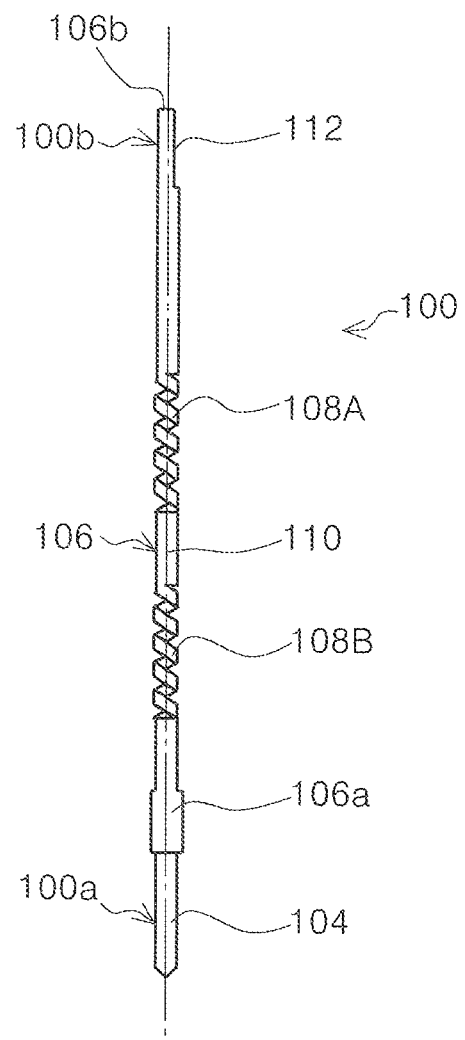
FIG. 3 is a side view of a probe according to the first embodiment.
Figure 3:
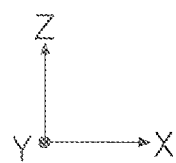
Figure 4:
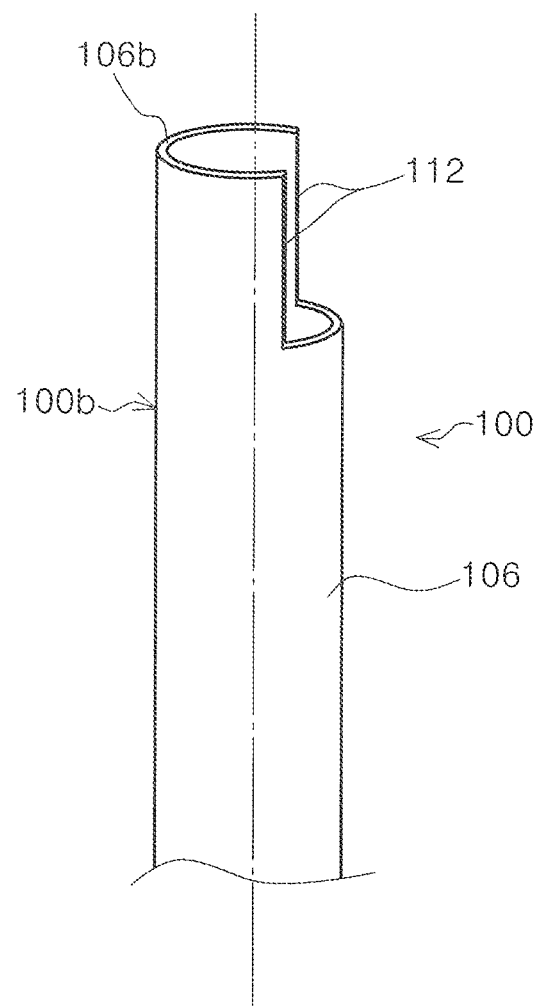
FIG. 4 is an enlarged view illustrating a rotation restricted portion of the probe according to the first embodiment.

Referring now to FIG. 3 and FIG. 4, the configuration of each probe 100 is described in detail. Each probe 100 includes a first contact portion 104 forming the first end 100a of the probe 100 and an elastic portion 106. The elastic portion 106 is formed as a tubular member in this embodiment. The elastic portion 106 is provided with an extendable portion 108 having at least one spiral slit in the axial direction thereof. In this embodiment, two extendable portions 108A and 108B (refer to FIG. 3) are provided in the elastic portion 106. Further, the intermediate portion 110 is provided between the extendable portions 108A and 108B.

In this embodiment, the first contact portion 104 is connected to a first end of the elastic portion 106. Specifically, the first contact portion 104 is welded to the first end of the elastic portion 106 ("lower end side" in FIG. 3). The elastic portion 106 has a welding part 106a at which the elastic portion 106 is welded to the first contact portion 104. The welding part 106a is larger in diameter than other parts of the elastic portion 106. The holes 24a and 26a of the probe head 16 have a diameter that is greater than that of the welding part 106a, i.e., the maximum diameter of the probes 100.

Further, in this embodiment, extendable portions 108A and 108B are formed as spiral slits along the axial direction (vertical direction) of the elastic portion 106. The extendable portions 108A and 108B are capable of expanding and contracting along the axial direction of the elastic portion 106. Also, in this embodiment, the intermediate portion 110, which corresponds to the intermediate retaining member 26 when the probe 100 is inserted through the probe head 16, is provided between the extendable portions 108A and 108B.

In this embodiment, a contact point portion 106b and a rotation restricted portion 112 are provided on a second end of the elastic portion 106 ("upper end side" in FIG. 3). The contact point portion 106b is provided on the second end of the elastic portion 106, that is, on the second end 100b of the probe 100. When the probe head 16 is attached to the probe substrate 12 with the probes 100 being inserted through the probe head 16, the contact point portions 106b are brought into contact with the contact portions 12a of the probe substrate 12.

In addition, a part of the elastic portion 106 on the side of the second end is cut away and is formed as a cutaway portion. In this embodiment, the rotation restricted portion 112 is formed as the cutaway portion. It should be noted that while a cutaway amount of the cutaway portion in the radial direction of the elastic portion 106 is set to be smaller than the radius of the elastic portion 106 in this embodiment, the cutaway amount may also be set to a value larger than the radius of the elastic portion 106.

The probes 100 are formed of conductive metal material. As one example, the probes 100 are formed of a conductive metal material having high toughness, such as nickel (Ni), nickel-phosphorus alloys (Ni—P), nickel-tungsten alloys (Ni—W), phosphor bronze, palladium-cobalt, alloys (Pd—Co) and palladium-nickel-cobalt alloys (Pd—Ni—Co).

Figure 5:
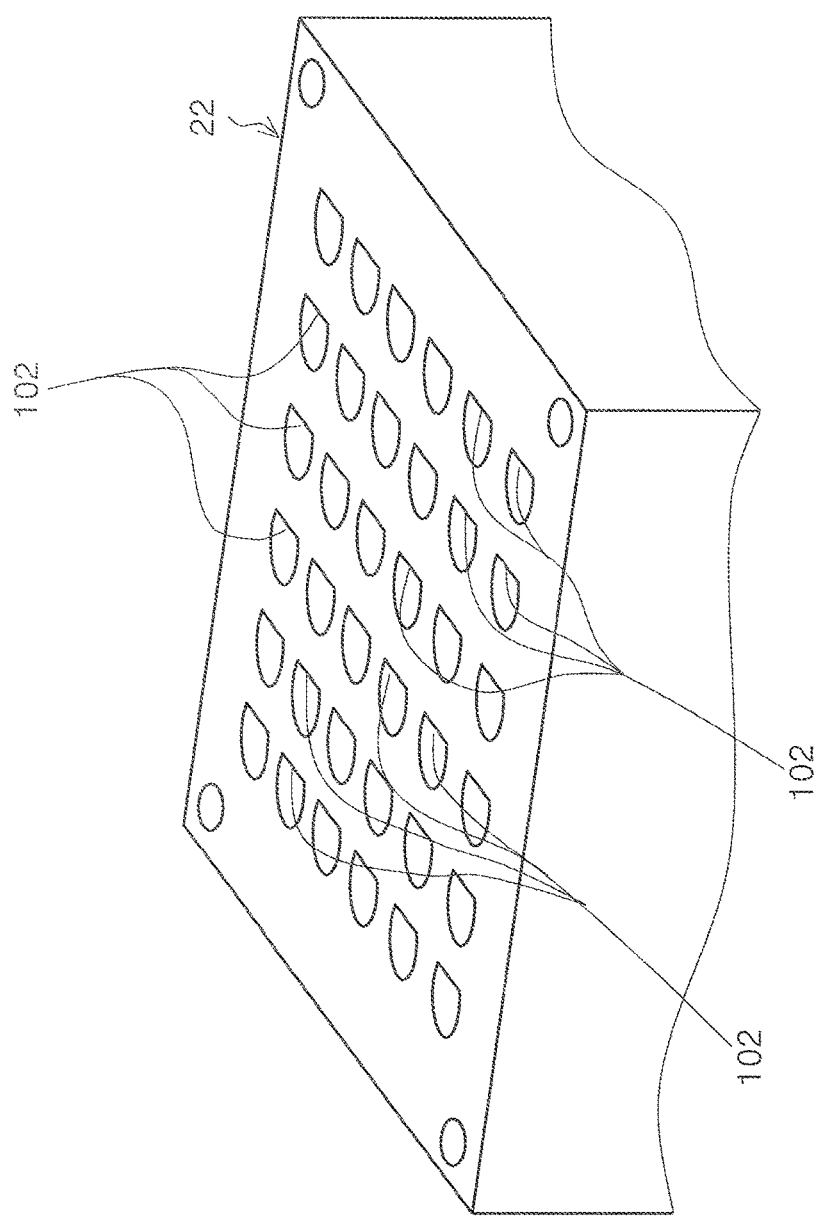
FIG. 5 is a perspective view illustrating an upper surface of a probe head according to the first embodiment.
Figure 6:
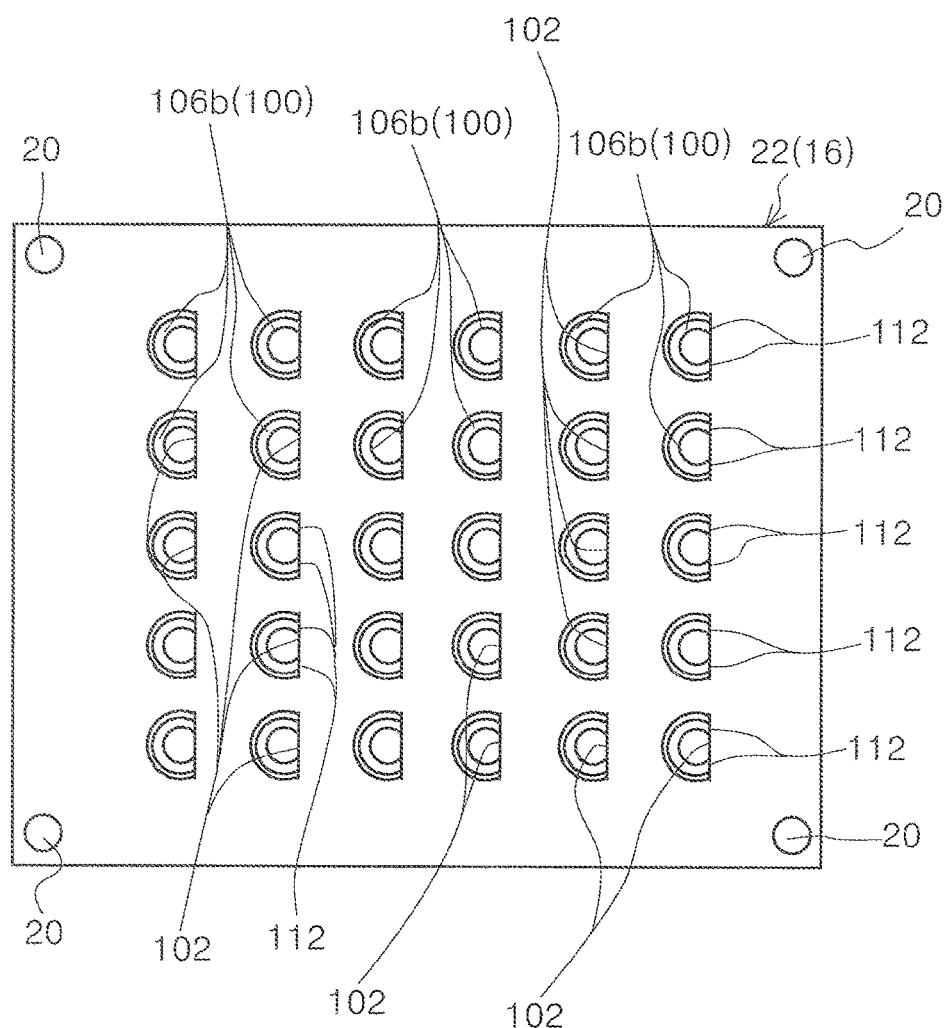
FIG. 6 is a plan view illustrating the upper surface of the probe head in a state where probes are inserted through the probe head.

Referring now to FIG. 5 and FIG. 6, the rotation restricting portions 102 are described. The plural rotation restricting portions 102 in this embodiment are provided in the upper probe head 22 of the probe head 16. More specifically, the rotation restricting portions 102 are provided in the upper probe head 22 such that the rotation restricting portions 102 face the contact portions 12a of the probe substrate 12 with the probe head 16 being attached to the probe substrate 12. In addition, the rotation restricting portions 102 are formed in the shape of the second end of the probe 100, i.e., in the shape corresponding to the shape of the rotation restricted portions 112. More specifically, the rotation restricting portions 102 of this embodiment are formed in the shape of the second end of the probe 100, that is, a letter D-shape corresponding to the shape of the cutaway portion. Further, the rotation restricting portion 102 penetrates through the upper probe head 22.

As shown in FIG. 6, when the second end 100b of the probe 100, that is, the second end of the elastic portion 106, is inserted through the rotation restricting portion 102 of the upper probe head 22, the cutaway portion that forms the rotation restricted portion 112 on the second end of the elastic portion 106 engages with a portion of the rotation restricting portion 102 that faces the cutaway portion. Thus, the rotation of the rotation restricted portion 112 about the axial direction of the probe 100 is restricted by the rotation restricting portion 102 when the second end 100b of the probe 100 tries to rotate about the axial direction of the probe 100. In other words, the rotation of the second end 100b of the probe 100 is restricted.

Accordingly, wear and damage generated at a contact part between the contact portion 12a of the probe substrate 12 and the second end 100b of the probe 100, that is, the contact point portion 106b, can be controlled. As a result, electrical connection between the probe 100 and the probe substrate 12 can be stabilized, and thus the reliability of the probe card 90 can be improved. It should be noted that sizes of the rotation restricting portions 102 and the probes 100 are exaggerated in FIG. 6 for the purpose of description.

In summary, the rotation restricted portion 112 engages with the rotation restricting portion 102 of the probe head 16 to restrict the rotation of the probe 100 about the axial direction of the probe 100 in a state where the second end 100b of the probe 100, that is, the contact point portion 106b is in contact with the contact portion 12a of the probe substrate 12. Thus, generation of wear and damage of the contact portion between the contact point portion 106b and the contact portion 12a of the probe substrate 12 can be controlled. As a result, electrical connection between the probe 100 and the probe substrate 12 can be stabilized, and thus the reliability of the probe card 90 can be improved.

Further, in this embodiment, when the first contact portion 104, which is the first end 100a of the probe 100, is brought into contact with the electrode 34a of the test object 34, the extendable portion 108 having a spiral slit provided between the first contact portion 104 and the contact point portion 106b contracts in the axial direction and absorbs a part of the pressing force. Then, although a part of the pressing force acts on the probe 100 to rotate the probe 100 about the axial direction, due to provision of the rotation restricted portion 112 that restricts the rotation of the probe 100 about the axial direction of the probe 100 on the second end 100b of the probe 100, the rotation of the probe at the second end 100b thereof about the axial direction is controlled. Thus, generation of wear and damage of the contact portion between the contact point portion 106b and the contact portion 12a of the probe substrate 12 can be controlled. As a result, electrical connection between the probe 100 and the probe substrate 12 can be stabilized, and thus the reliability of the probe card 90 can be improved.

The elastic portion 106 of the probe 100 is formed of a tubular member. Therefore, when rotation occurs repeatedly between the contact point portion 106b of the elastic portion 106 of the probe 100 and the contact portion 12a of the probe substrate 12, the contact portion 12a of the probe substrate 12 wears out annularly. In other words, wear is concentrated on the same portion. As a result, fluctuation in contact pressure occurs between the probe 100 and the probe substrate 12, and electrical connection between the probe 100 and the probe substrate 12 becomes unstable.

However, in this embodiment, rotation of the contact point portion 106b about the axial direction of the probe 100 is restricted by the rotation restricted portion 112. Accordingly, the rotation at the contact point portion 106b is restricted even when the elastic portion 106 is formed by a tubular member. Thus, generation of wear and damage between the contact point, portion 106b and the contact portion 12a of the probe substrate 12 can be controlled even more effectively, and electrical connection between the probe 100 and the probe substrate 12 can be stabilized.

In this embodiment, because the rotation restricted portion 112 is formed as a cutaway portion, the rotation restricted portion 112 can be formed easily on the second end of the elastic portion 106.

<<<Modification of First Embodiment>>>

Figure 7:
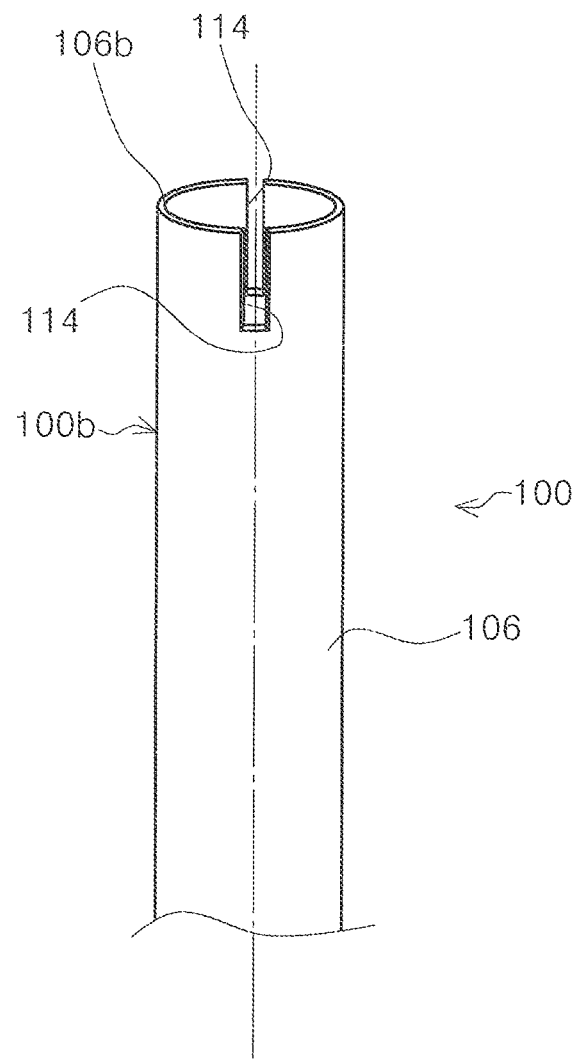
FIG. 7 is a perspective view illustrating the rotation restricted portion according to one modification of the first embodiment.
Figure 8:
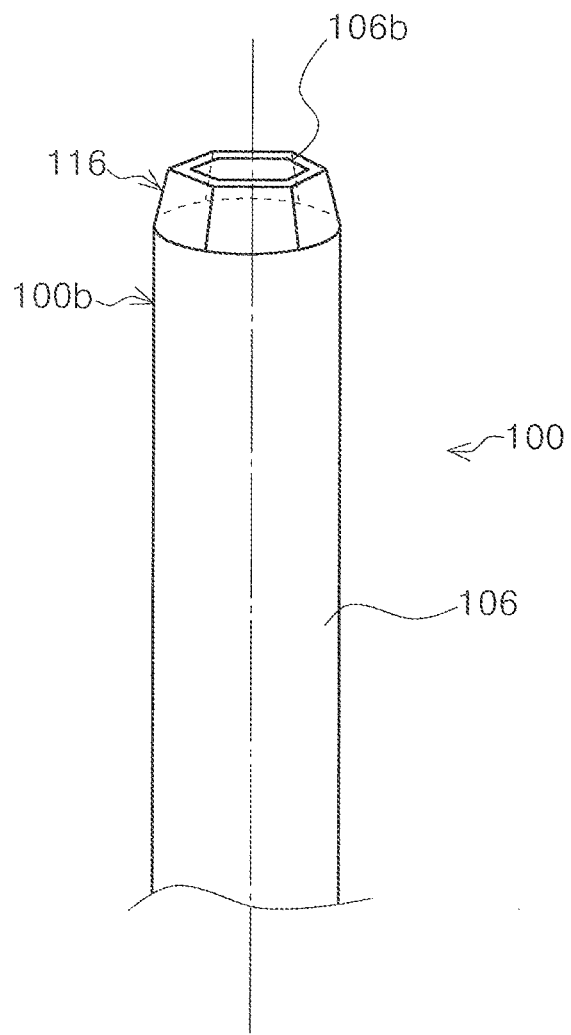
FIG. 8 is a perspective view illustrating the rotation restricted portion according to another modification of the first embodiment.
Figure 9:
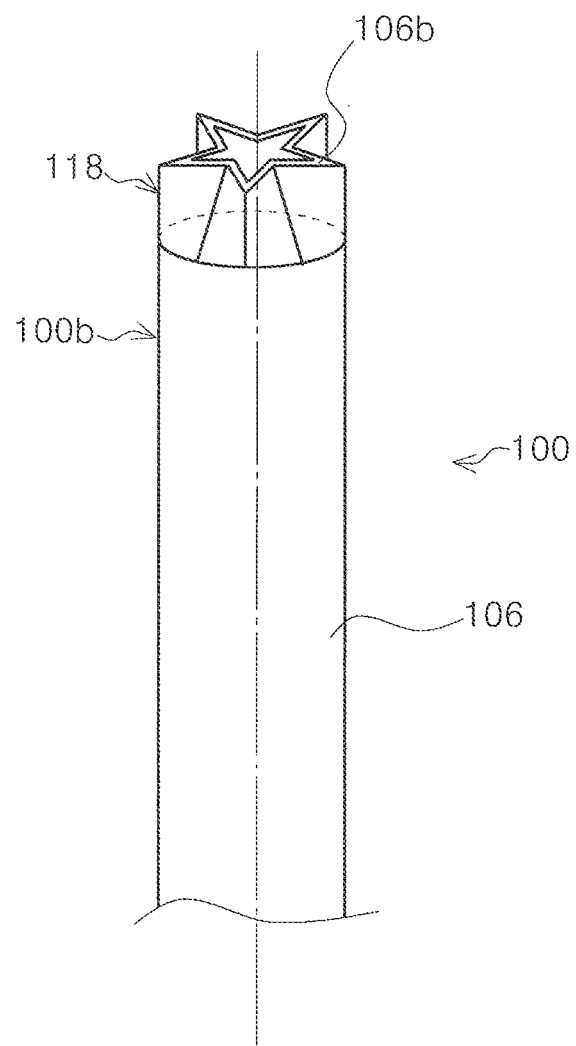
FIG. 9 is a perspective view illustrating the rotation restricted portion according to still another modification of the first embodiment.

(1) While the rotation restricted portion 112 is formed as a cutaway portion on the second end 100b of the probe 100, that is, the second end of the elastic portion 106, instead, a rotation restricted portion 114 in the form of a slit may be formed at the second end 100b of the probe 100 as shown in FIG. 7. Moreover, as shown in FIG. 8 and FIG. 9, the second end of the elastic portion 106 (second end 100b of the probe 100) made of a tubular member may be formed into a polygonal shape by press forming or the like to obtain rotation restricted portions 116 and 118. As an example, in FIG. 8, the rotation restricted portion 116 is formed in a hexagonal shape, whereas in FIG. 9, the rotation restricted portion 118 is formed in a star shape. It should be noted that, in this case, the shape of the rotation restricting portions 102 provided at the upper probe head 22 are formed so as to correspond to the shapes of the rotation restricted portions 114, 116, and 118 provided on the second end of the elastic portion 106.

Further, by forming the rotation restricted portions 116 and 118 on the elastic portion 106 in a polygonal shape, force that acts on the rotation restricted portions 116 and 118 to restrict the rotation about the axial direction can be dispersed to each surface of the polygonal shape. Accordingly, less force is required to control the rotation of the second end 100b of the probe 100.

Figure 10A:
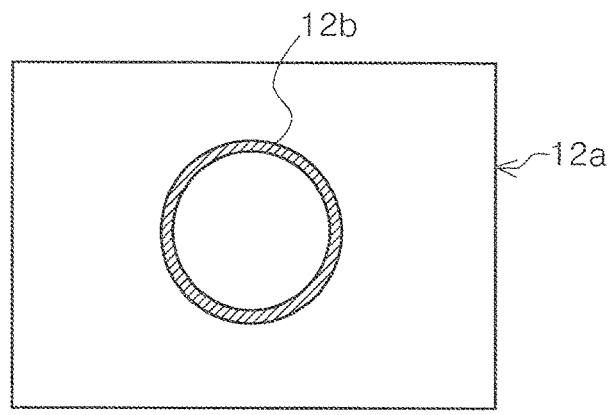
FIG. 10(A) is a schematic view illustrating a state of contact when the shape of a contact point portion on the probe substrate is tubular.
Figure 10B:
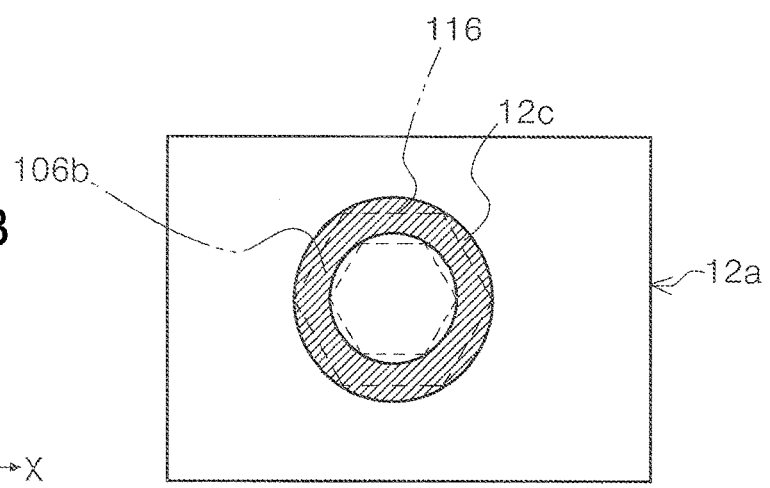
FIG. 10(B) is a schematic view illustrating a state of contact when the shape of a contact point portion on the probe substrate is hexagonal.

In addition, as shown in FIG. 10(A), if the contact point portion 106b of the elastic portion 106 has a tubular shape, an annular contact region 12b is formed when the contact point portion 106b rotates relative to the contact portion 12a of the probe substrate 12. On the other hand, as shown in FIG. 10(B), if the hexagonal rotation restricted portion 116 is formed on the second end of the elastic portion 106 (second end 100b of the probe 100), an annular contact region 12c is formed when the contact point portion 106b rotates relative to the contact portion 12a of the probe substrate 12.

This contact region 12c is a region formed between a circumscribed circle passing through vertices on an outer peripheral side of the hexagon and an inscribed circle passing through vertices on an inner peripheral side of the hexagon. Further, an area of the contact region 12c is larger than an area of the contact region 12b. As a result, frictional force between the contact portion 12a and the contact point portion 106b increases and this frictional force acts to prevent the rotation of the elastic portion 106. Thus, the rotation of the elastic portion 106 can be controlled. In addition, due to an increase in the contact area between the contact point portion 106b and the contact portion 12a, the contact pressure per unit area between the contact point portion 106b and the contact portion 12a can be reduced. Thus, wear of the contact portion 12a is reduced.

Figure 10C:
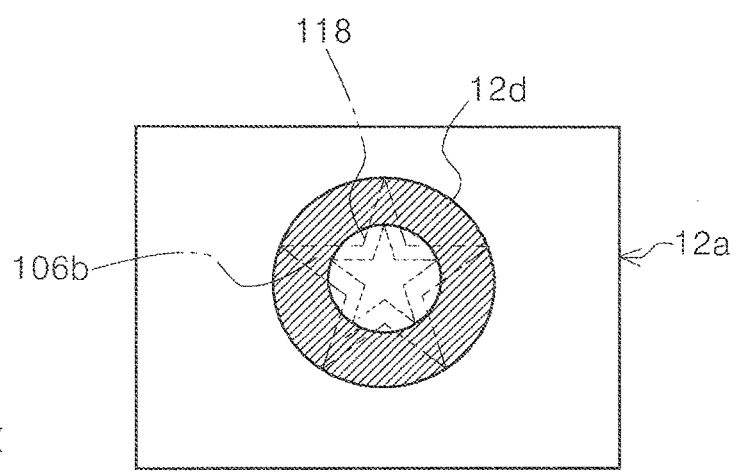
FIG. 10(C) is a schematic view illustrating a state of contact when the shape of a contact point portion on the probe substrate is a star.

FIG. 10(C) illustrates a case in which the shape of the rotation restricted portion 118 of the elastic portion 106 is formed as a star. A contact region 12d is a region formed between a circumscribed circle passing through vertices on an outer peripheral side of the star and an inscribed circle passing through vertices on an inner peripheral side of the star. With this configuration, an area of the contact region 12d is larger than that of the contact regions 12b and 12c. Thus, more of the above-described effect can be obtained by the contact region 12d than by the contact region 12c.

In other words, by forming the rotation restricted portions 116 and 118 on the second end of the elastic portion 106 into a polygonal shape, the contact area between the contact point portion 106b provided on the second end and the contact portion 12a of the probe substrate 12 increases, thereby increasing the frictional force between the contact point portion 106b and the contact portion 12a. Thus, the rotation of the probe 100 can be controlled. In addition, when forming the rotation restricted portions 116 and 118 by press forming, complex shapes can be easily formed on the second end of the elastic portion 106 (second end 100b of the probe 100). Further, because a tubular member is formed into a polygonal shape, the strength (rigidity) of the tubular member can be increased.

(2) While each probe 100 has two extendable portions 108 in this embodiment, each probe 100 may instead have one or three or more extendable portions 108.

(3) While the two extendable portions 108A and 108B of each probe 100 are spiraled in the same direction in this embodiment, the two extendable portions 108A and 108B may be instead spiraled in opposite directions.

(4) In this embodiment, the shape of the rotation restricting portion 102 is formed in a letter D-shape to correspond to the shape of the rotation restricted portion 112. However, the rotation restricting portion 102 may be formed in, for example, a rectangular shape, such that one edge of the rectangle engages with the rotation restricted portion 112 to restrict the rotation.

(5) Further, the probe 100 of this embodiment may be configured such that freely extendable and contractible contact portions are provided on both ends of the elastic portion 106, that is, the probe 100 may be configured as something similar to a Pogo pin (JP 2014-025761 A, etc.).

Second Embodiment

Figure 11:
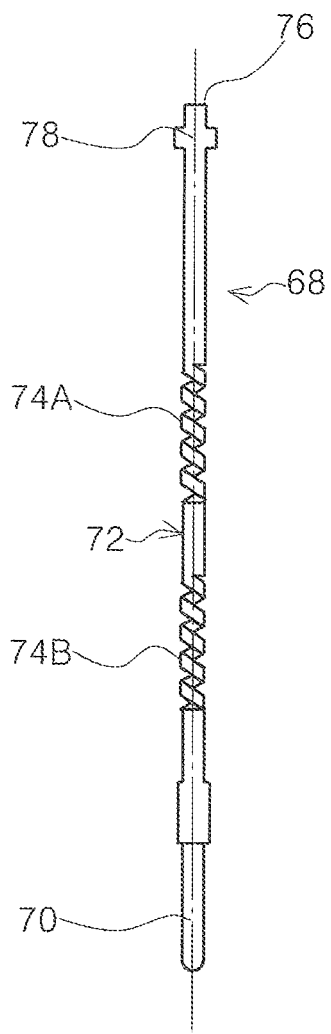
FIG. 11 is a side view of a probe according to a second embodiment.
Figure 12:
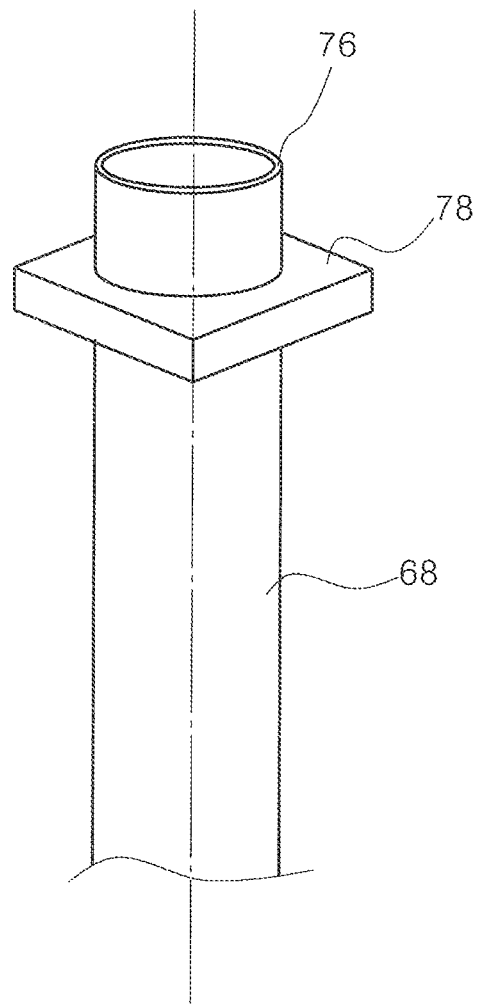
FIG. 12 is an enlarged view illustrating the rotation restricted portion of the probe according to the second embodiment.
Figure 12:
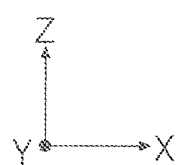

Referring to FIG. 11 and FIG. 12, a second embodiment will now be described. Referring to FIG. 11, a probe 68 according to the second embodiment includes a first contact portion 70 and an elastic portion 72. The elastic portion 72 is connected to the first contact portion 70 at an end on the −Z side in FIG. 11. The elastic portion 72 has two extendable portions 74A and 74B with spiral slits (refer to FIG. 11) which are provided at an interval in the axial direction of the probe 68 (Z-axis direction in FIG. 11). It should be noted that an end of the elastic portion 72 on the +Z side in FIG. 11 shall be referred to as a contact point portion 76. An end of the elastic portion 72 with the contact point portion 76 is provided with the rotation restricted portion 78 (refer to FIG. 12).

In this embodiment, as shown in FIG. 12, the rotation restricted portion 78 is formed as a protrusion that protrudes from the elastic portion 72 in the radial direction of the elastic portion 72. Also, the rotation restricted portion 78 in this embodiment is formed in a rectangular shape. Further, although not shown in this embodiment, the rotation restricting portion 102 provided on the upper probe head 22 of the probe head 16 is formed as a rectangular through hole of a size corresponding to the rectangular rotation restricted portion 78. In other words, when the probe 68 is inserted through the probe head 16, the rotation restricted portion 78 of the probe 68 is in engagement with the rectangular rotation restricting portion 102 of the probe head 16. As a result, the rotation restricting portion 102 restricts the rotation of the rotation restricted portion 78, and thus the rotation of the probe 68 about the axial direction thereof is restricted.

Third Embodiment

Next, a third embodiment will be described with reference to FIGS. 13 through 18. The probe card 10 of this embodiment is different, from the first embodiment in that plural positioning members 36 and 38 are provided between the probe head 16 and the probe substrate 12 and that rotation restricting portions 56 and 58 are formed on the positioning members 36 and 38.

<<<Outline of Probe Card>>>

Figure 15:
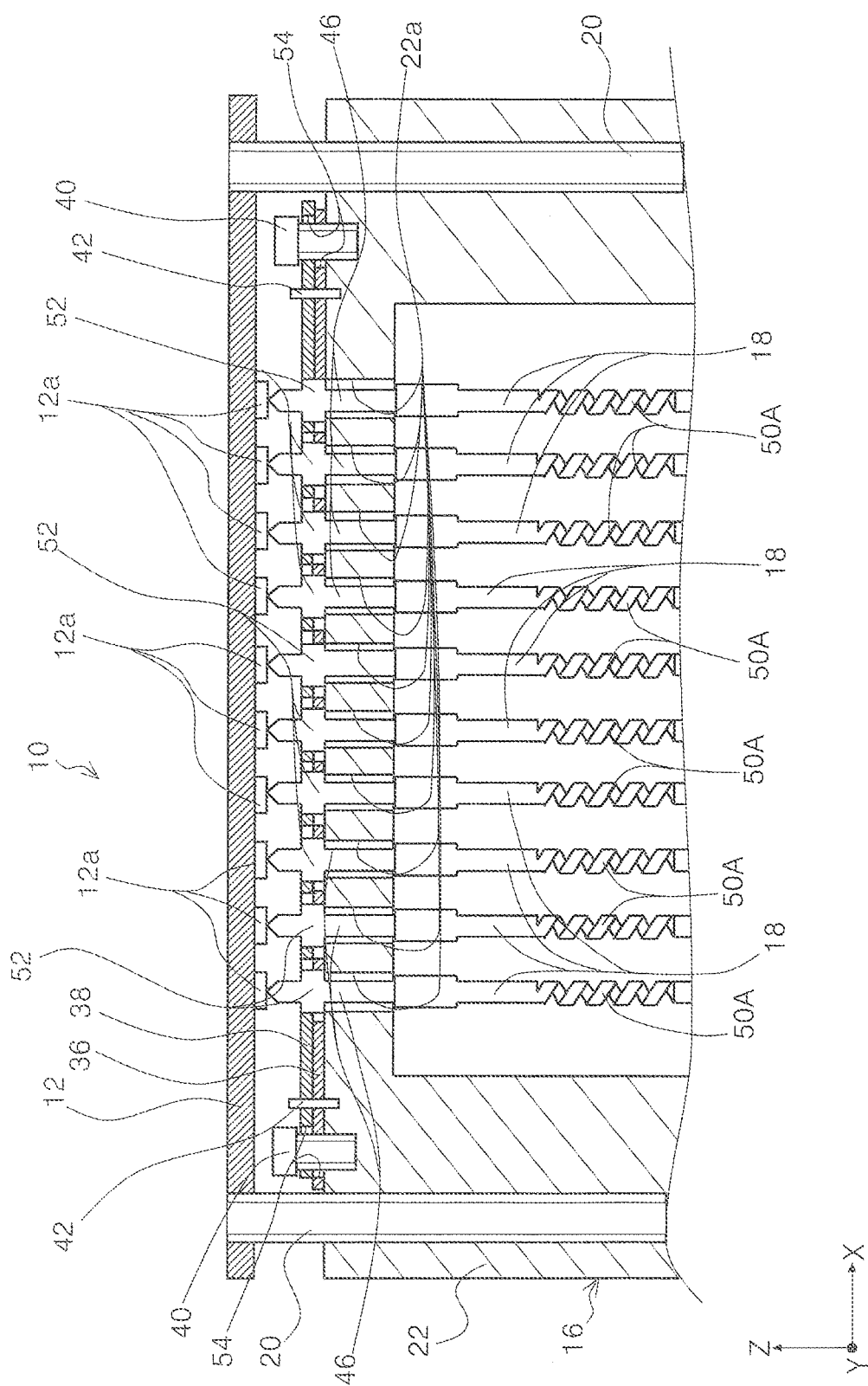
FIG. 15 is a sectional side view of a contact inspection device provided with the probe according to the third embodiment.

As shown in FIG. 15, in the probe card 10 of this embodiment, plural holes 22a are formed in the upper probe head 22 of the probe head 16, instead of the rotation restricting portion 102. The plural holes 22a extend in the vertical direction (Z-axis), and have common axes extending in the vertical direction with the holes 24a and 26a. In other words, the axes of a set of holes 22a, 24a, and 26a are arranged coaxially.

The plural probes 18 are inserted through the probe head 16. Specifically, each probe 18 is inserted through a set of coaxially-arranged holes 22a, 24a, and 26a. In other words, the probes 18 are inserted through the upper probe head 22, the lower probe head 24, and the intermediate retaining member 26. Here, each probe 18 has a first end 18a (refer to FIG. 13) and a second end 18b (refer to FIG. 13) that individually protrude vertically from the probe head 16.

As shown in FIG. 15, plural positioning members 36 and 38 are attached to an upper surface of the probe head 16, i.e., an upper surface of the upper probe head 22, via fastening members 40 and positioning pins 42. In this embodiment, the positioning members 36 and 38 include a first positioning member 36 and a second positioning member 38. The positioning members 36 and 38 are described in detail later. The second ends 18b (refer to FIG. 13) of the probes 18 are inserted through the positioning members 36 and 38, and protrude toward the probe substrate 12 from the positioning members 36 and 38.

<<<Regarding Configuration of Probe>>>

Figure 13:
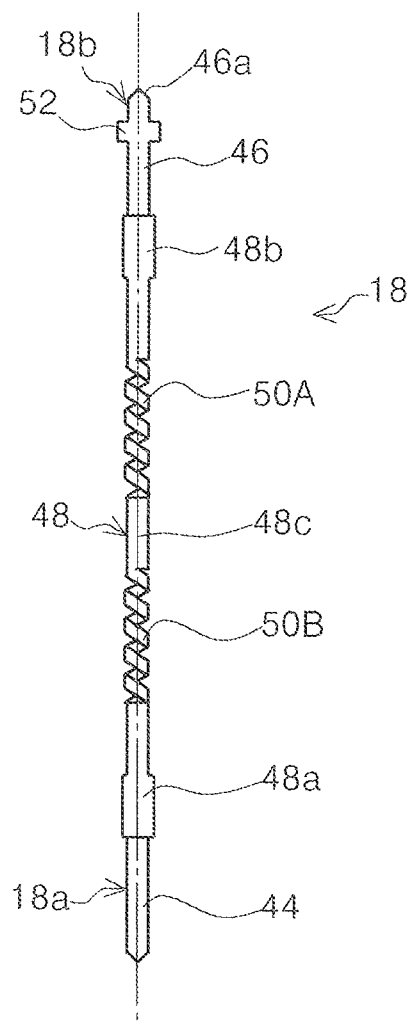
FIG. 13 is a side view of a probe according to a third embodiment.
Figure 14:
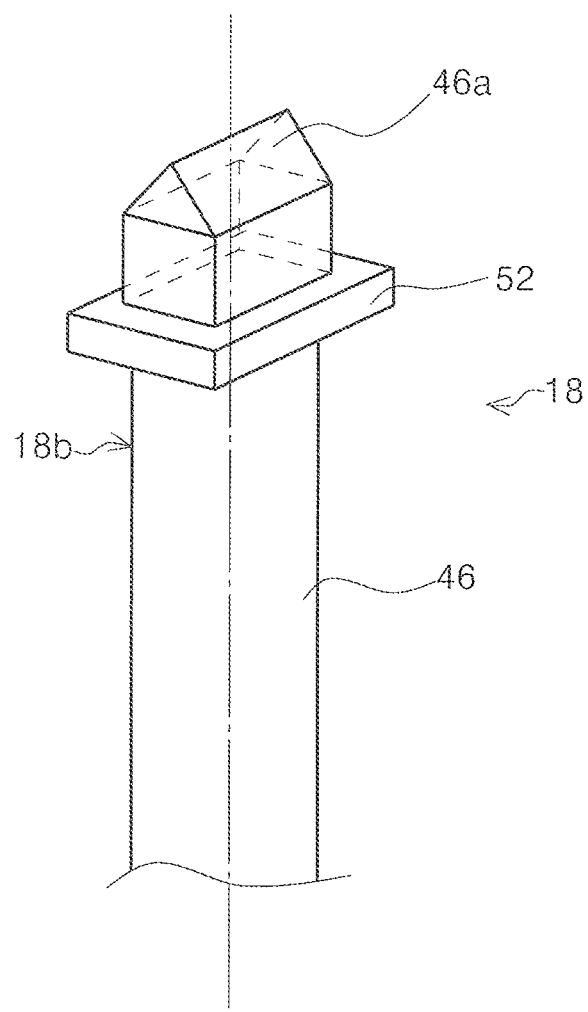
FIG. 14 is an enlarged view illustrating the rotation restricted portion of the probe according to the third embodiment.
Figure 14:
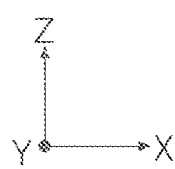

Referring now to FIG. 13 and FIG. 14, the configuration of each probe 18 is described in detail. Each probe 18 includes a first contact portion 44 forming the first end 18a of the probe 18, a second contact portion 46 forming the second end 18b of the probe 18, and an elastic portion 48. The first contact portion 44 and the second contact portion 46 are connected to opposite ends of the elastic portion 48.

In this embodiment, the first contact portion 44 and the second contact portion 46 are welded to opposite ends of the elastic portion 48. The elastic portion 48 has welding parts 48a and 48b at which the elastic portion 48 is welded to the first contact portion 44 and the second contact portion 46. The welding parts 48a and 48b are larger in diameter than other parts of the elastic portion 48. The holes 22a, 24a, and 26a of the probe head 16 have a diameter that is greater than that of the welding parts 48a and 48b, i.e., the maximum diameter of the probes 18.

The elastic portion 48 is provided with extendable portions 50A and 50B (refer to FIG. 13) having spiral slits that generate an elastic force in the axial direction of the elastic portion 48 (in the vertical direction). The extendable portions 50A and 50B are provided at two locations spaced apart in the axial direction. An intermediate portion 48c, which corresponds to the intermediate retaining member 26 when the probe 18 is inserted through the probe head 16, is provided between the extendable portions 50A and 50B.

The second contact portion 46 has a polygonal rotation restricted portion 52. As shown in FIG. 14, in this embodiment, the rotation restricted portion 52 has a rectangular shape. In this embodiment, the thickness of the rotation restricted portion 52 in the axial direction is at least larger than that of the first positioning member 36. In other words, the rotation restricted portion 52 has a sufficient thickness to engage the first positioning member 36 and the second positioning member 38 when the probe 18 is inserted through the first positioning member 36 and the second positioning member 38.

The rotation restricted portion 52 has a size that is larger than the diameter of the holes 22a, 24a, and 26a of the probe head 16. In other words, when the probe 18 is inserted through the probe head 16, the rotation restricted portion 52 cannot pass through the hole 22a and the lower surface of the rotation restricted portion 52 abuts against the upper surface of the upper probe head 22. Thus, when the first contact portion 44 of the probe 18 is passed through its corresponding holes 22a, 24a, and 26a of the probe head 16 until it protrudes from the lower probe head 24, the rotation restricted portion 52 is supported by the upper probe head 22.

In this embodiment, the second contact portion 46 has a tip portion 46a having the shape of a triangular prism extending in a direction orthogonal to the axial direction (vertical direction), i.e., in the X-axis direction or Y-axis direction. One edge of the triangular prism extending in the axial direction thereof is located at the top of the tip portion 46a in the vertical direction, in other words, forms a ridge. Thus, because this edge of the tip portion 48a will be brought into contact with one of the contact portions 12a of the probe substrate 12, the probe 18 and the contact portion 12a of the probe substrate 12 will make a line contact with each other. The probes 18 are formed of conductive metal material similar to the probes 100.

<<<Regarding Positioning Members>>>

Figure 16:
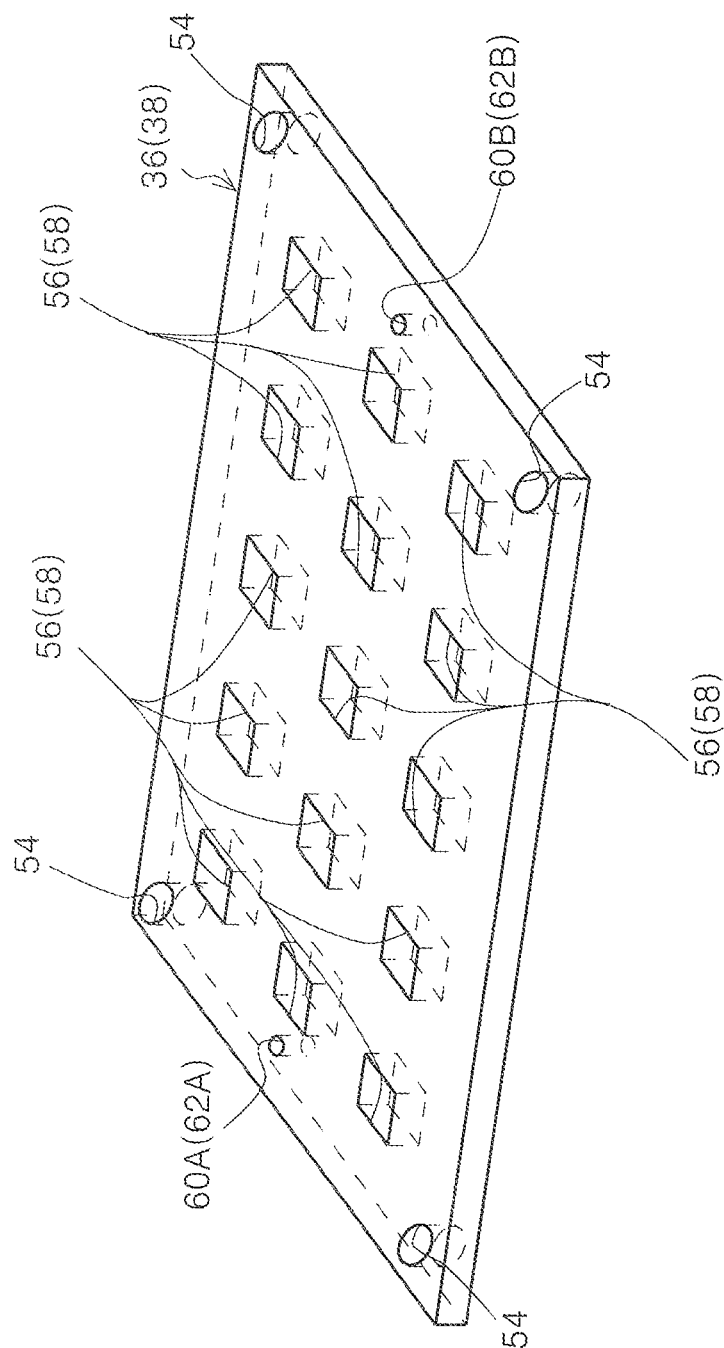
FIG. 16 is a perspective view of a positioning member according to the third embodiment.

Referring next to FIG. 16, the first positioning member 36 and the second positioning member 38 are described. In this embodiment, the first positioning member 36 and the second positioning member 38 are formed as plate-like members made of non-conductive material such as ceramic. It should be noted that the first positioning member 36 is shown in FIG. 16 for descriptive purposes, and description is made using the first positioning member 36.

Figure 17:
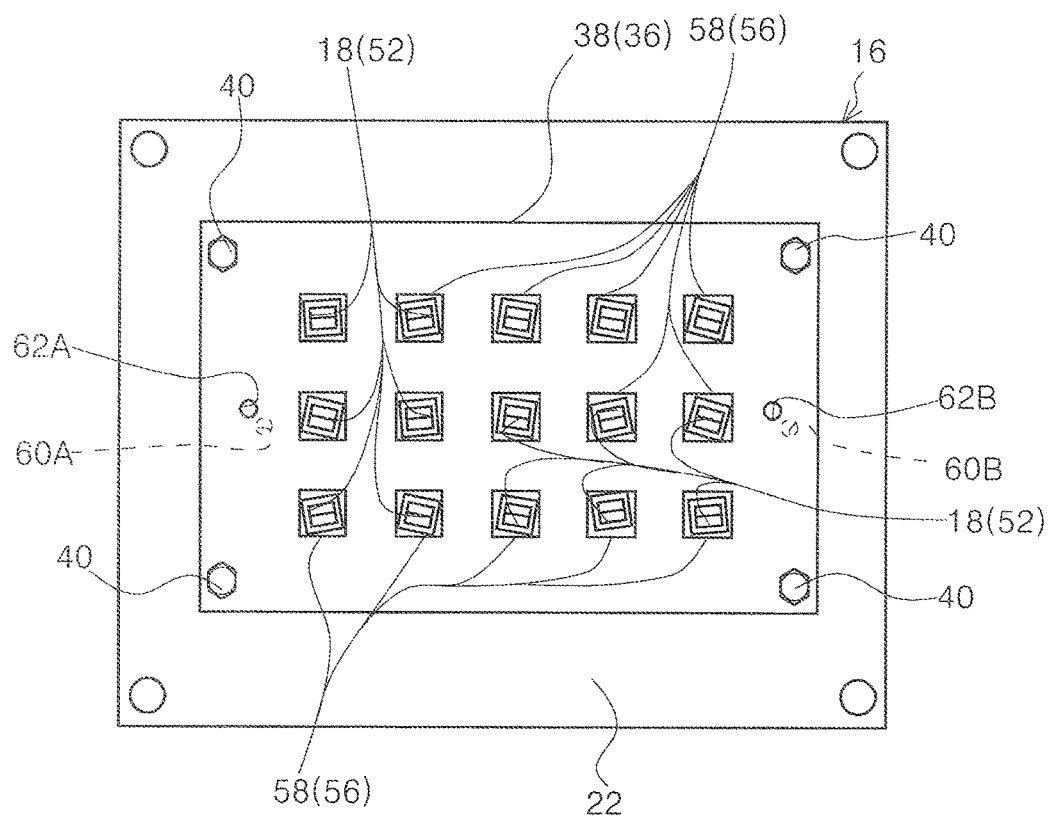
FIG. 17 is a plan view illustrating a state of the probe inserted through the probe head and the positioning members.
Figure 18:
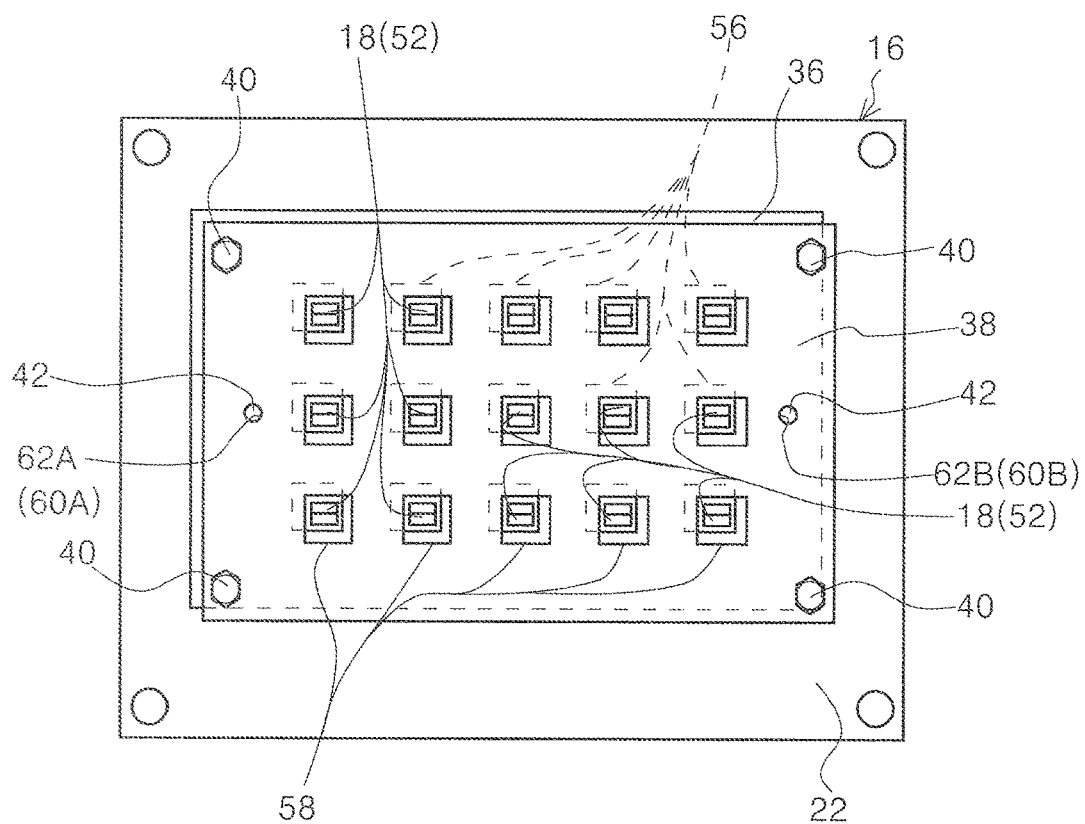
FIG. 18 is a plan view illustrating a state where plural positioning members are moved relative to each other so as to align the probes inserted through the probe head, whereby the probes are switched from a rotation unrestricted state to a rotation restricted state.
Figure 18:
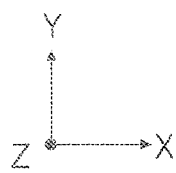

The first positioning member 36 has through holes 54 (refer to FIG. 16), at its four corners, for fastening members 40 that are used to detachably attach the first positioning member 36 and the second positioning member 38 to the upper probe head 22. As shown in FIG. 16, the through holes 54 are formed as slotted holes extending in a diagonal direction of the first positioning member 36 and the second positioning member 38. In FIG. 17 and FIG. 18, illustration of the through holes 54 is omitted.

The first positioning member 36 has plural rotation restricting portions 56 aligned at appropriate intervals in the X-axis direction and Y-axis direction. The rotation restricting portions 56 have a polygonal shape. In this embodiment, the rotation restricting portions 56 have a rectangular shape. The rotation restricting portions 56 have a size that is large enough that the rotation restricted portions 52 of the probes 18 can pass through them. The second positioning member 38 also has rotation restricting portions 58, which are similar to the rotation restricting portions 56 of the first positioning member 36.

The first positioning member 36 has plural positioning holes 60A and 60B for receiving the positioning pins 42. The second positioning member 38 also has plural positioning holes 62A and 62B. The positioning holes 60A and 60B of the first positioning member 36 and the positioning holes 62A and 62B of the second positioning member 38 are formed such that the axes of the positioning holes 60A and 60B coincide with the axes of the positioning holes 62A and 62B when the first positioning member 36 and the second positioning member 38 are moved relative to each other, as described later.

<<<Regarding Switching of Probes Between Rotation Unrestricted State and Rotation Restricted State>>>

Referring to FIG. 17, the rectangular rotation restricting portions 56 of the first positioning member 36 and the rectangular restricting portions 58 of the second positioning member 38 are located at the same positions in the X-axis direction and Y-axis direction and overlap with each other at an upper part of the upper probe head 22. It should be noted that, in this state, the positioning holes 60A and 60B of the first positioning member 36 and the positioning holes 62A and 62B of the second positioning member 38 are offset from each other in the X-axis direction and Y-axis direction.

As shown in FIG. 17, the probes 18 are inserted from above the first positioning member 36 and the second positioning member 38 into the probe head 16 through the rotation restricting portions 56 and 58. In other words, FIG. 17 shows that the rotation restricted portions 52 of the probes 18 are received in the rotation restricting portions 56 and 58. In this state, because the rotation restricting portions 56 and 58 are larger in size than the rotation restricted portions 52, the rotation restricted portions 52 are still unaligned, in other words, the ridges of the tip portions 46a of the second contact portions 46 are directed in different directions in the rotation restricting portions 56.

In this state, the fastening members 40 are loosened. Then, the first positioning member 36 and the second positioning member 38 are moved relative to each other on the upper probe head 22 without being removed therefrom. Specifically, the first positioning member 36 and the second positioning member 38 are moved along a diagonal of the rectangular rotation restricting portions 56 and 58.

When the first positioning member 36 and the second positioning member 38 are further moved relative to each other along a diagonal of the rectangular rotation restricting portions 56 and 58, the rotation restricted portions 52 of the probes 18 inserted inside the rotation restricting portions 56 and 58 are pressed against side walls of the rotation restricting portions 56 and 58 and rotate about the axes of the probes 18. Thus, four sides of the rectangular rotation restricted portions 52 of the probes 18 engage the side walls of the rotation restricting portions 56 and 58.

In other words, because each of the first positioning member 36 and the second positioning member 38 engages two sets of two sides facing each other at rectangular rotation restricted portions 52, the rotation restricted portions 52 are restricted from moving in the X-axis direction and Y-axis direction. In other words, the rotation restricted portions 52 are positioned by the first positioning member 36 and the second positioning member 38. In addition, because the rotation restricting portions 56 and 58 engage the four sides of the rotation restricted portions 52, the rotation restricting portions 56 and 58 can restrict the rotation restricted portions 52 from rotating about the axes of the probes 18.

As a result, as shown in FIG. 18, when the first positioning member 36 and the second positioning member 38 are moved relative to each other along a diagonal of the rectangular rotation restricting portions 56 and 58, the rotation restricted portions 52, which are unaligned when received in the rotation restricting portions 56 and 58, are positioned and the probes 18 is restricted from rotating about the axes.

Then, because the positioning holes 60A and 60B of the first positioning member 36 and the positioning holes 62A and 62B of the second positioning member 38 correspond in position to each other in the X-axis direction and Y-axis direction, the positioning pins 42 are inserted into the positioning hole 62A corresponding to the positioning hole 60A and into the positioning hole 62B corresponding to the positioning hole 60B, respectively. Then, by tightening the plural fastening members 40, relative positions of the first positioning member 36 and the second positioning member 38 can be fixed, and the position and rotation restricted state of each rotation restricted portion 52 can be maintained. In other words, by moving the first positioning member 36 and the second positioning member 38 relative to each other, the probes 18 can be switched from a rotation unrestricted state to a rotation restricted state.

In addition, when the positioning pins 42 inserted into the positioning holes 62A (60A) and 62B (60B) are pulled out from the positioning holes 62A (60A) and 62B (60B) and the plural fastening members 40 are loosened from the state where the probes 18 are restricted from rotating as shown in FIG. 18, the first positioning member 36 and the second positioning member 38 can be moved relative to each other. Then, the probes 18 can be switched from the rotation restricted state to the rotation unrestricted state. Then, because the probes 18 can be individually pulled out from the probe head 16, any probes 18 damaged in the probe head 16 can be easily replaced.

In addition, because the probes 18 can be positioned and restricted from rotating simply by inserting the probes 18 into the probe head 16 and moving the first positioning member 36 and the second positioning member 38 relative to each other, the probe head 16 can be assembled easily.

<<<Modification of Third Embodiment>>>
(1) The probe 68 in the second embodiment may be used in place of the probe 18 in this embodiment.
(2) While the first positioning member 36 and the second positioning member 38 are provided at the upper part of the upper probe head 22 in this embodiment, only the first positioning member 36 may be provided at the upper part of the upper probe head 22. In this configuration, by making the size of the rotation restricting portion 56 of the first positioning member 36 a size corresponding to the rotation restricted portion 52 of the probe 18, the rotation of the probe 18 about the axial direction thereof can be restricted merely by receiving the rotation restricted portion 52 of the probe 18 by the rotation restricting portion 56.

It goes without saying that the present invention is not limited to the above embodiments, and various modifications are possible within the scope of the invention set forth in the claims and such modifications are also included in the scope of the present invention.

The invention claimed is:

1. A probe comprising:
a first end that contacts and separates from a test object; and
a second end that contacts a circuit board to perform inspection of the test object and is formed by a tubular member, wherein
the second end has a rotation restricted portion that restricts rotation of the probe about the axial direction thereof,
the rotation restricted portion is formed along with an outer periphery of the tubular member so as not to protrude in a radial direction of the probe from the outer periphery of the tubular member, and
the rotation restricted portion is formed by forming the second end of the tubular member into a polygonal shape.

2. The probe according to claim 1, wherein
an extendable portion, which is freely extendable and contractible in the axial direction of the probe and having at least one spiral slit, is provided between the first end and the second end.

3. The probe according to claim 2, wherein
at least two of the extendable portions are provided between the first end and the second end, and
an intermediate portion is formed between the extendable portions.

4. The probe according to claim 1, wherein
at least two of the extendable portions are provided between the first end and the second end, and
an intermediate portion is formed between the extendable portions.

5. The probe according to claim 1, wherein
the rotation restricted portion is formed as a cutaway portion formed by cutting away a part of the second end.

6. The probe according to claim 2, wherein
the rotation restricted portion is formed as a cutaway portion formed by cutting away a part of the second end.

7. The probe according to claim 1, further comprising:
a first contact portion that constitutes a first end of the probe; and
a second contact portion that constitutes a second end of the probe, wherein
the second contact portion makes a line contact with the circuit board.

8. The probe according to claim 2, further comprising:
a first contact portion that constitutes a first end of the probe; and
a second contact portion that constitutes a second end of the probe, wherein
the second contact portion makes a line contact with the circuit board.

9. A contact inspection device that performs contact inspection of a test object, comprising:
plural probes each of which according to claim 1;
a circuit board that contacts the second end of the probe; and
a probe head through which the plural probes are inserted and which is detachably attached to the circuit board, wherein
a rotation restricting portion that engages with the rotation restricted portion of the probe is provided on the probe head on a side opposing the circuit board.

10. A contact inspection device that performs contact inspection of a test object, comprising:
plural probes each of which according to claim 2;
a circuit board that contacts the second end of the probe; and
a probe head through which the plural probes are inserted and which is detachably attached to the circuit board, wherein
a rotation restricting portion that engages with the rotation restricted portion of the probe is provided on the probe head on a side opposing the circuit board.

11. The probe according to claim 1, wherein
the rotation restricted portion is formed as a cutaway portion formed by cutting away a part of the second end, and
the cutaway portion has a side surface extending in an axial direction of the probe and lower surface that faces to the circuit board and is formed along with an outer periphery of the tubular member.

12. The probe according to claim 11, wherein the side surface is provided at a position different from the upper surface in the axial direction.

13. The probe according to claim 1, wherein
the second end has a contact point portion that abuts the circuit board, and
the rotation restricted portion is provided axially adjacent to the contact point portion.

14. A probe comprising:
a first end that contacts and separates from a test object; and
a second end that contacts a circuit board to perform inspection of the test object and is formed by a tubular member, wherein
the second end has a rotation restricted portion that restricts rotation of the probe about the axial direction thereof,
the rotation restricted portion is formed along with an outer periphery of the tubular member so as not to protrude in a radial direction of the probe from the outer periphery of the tubular member, and
the rotation restricted portion is formed by forming the second end into a polygonal shape.

15. A probe comprising:
a first end that contacts and separates from a test object; and
a second end that contacts a circuit board to perform inspection of the test object and is formed by a tubular member, wherein
the second end has a rotation restricted portion that restricts rotation of the probe about the axial direction thereof,
the rotation restricted portion is formed along with an outer periphery of the tubular member so as not to protrude in a radial direction of the probe from the outer periphery of the tubular member,
the rotation restricted portion is formed as a cutaway portion formed by cutting away a part of the second end,
the cutaway portion has a side surface extending in an axial direction of the probe and an upper surface that faces to the circuit board and is formed along with an outer periphery of the tubular member, and
the side surface of the cutaway portion is configured to abut a side surface of a probe head through which the probe is inserted and which is detachably attached to the circuit board.

* * * * *